United States Patent [19]

Berghaeuser et al.

[11] Patent Number: 4,530,897
[45] Date of Patent: Jul. 23, 1985

[54] PROCESS FOR DESENSITIZING DIAZO LITHOGRAPHIC PRINTING FORMS USING DESENSITIZING SOLUTION WITH LIGHT ABSORBING COMPOUND

[75] Inventors: Günter Berghaeuser, Wiesbaden; Loni Schell, Hofheim; Werner Frass, Wiesbaden, all of Fed. Rep. of Germany

[73] Assignee: Hoechst Aktiengesellschaft, Frankfurt am Main, Fed. Rep. of Germany

[21] Appl. No.: 547,465

[22] Filed: Nov. 2, 1983

Related U.S. Application Data

[62] Division of Ser. No. 397,092, Jul. 12, 1982, abandoned.

[30] Foreign Application Priority Data

Jul. 13, 1981 [DE] Fed. Rep. of Germany ....... 3127668

[51] Int. Cl.$^3$ ................................................. G03F 7/08
[52] U.S. Cl. ..................... 430/302; 430/309; 430/331; 430/512; 101/456; 101/465
[58] Field of Search ............... 430/331, 512, 514, 302, 430/309; 101/456, 465

[56] References Cited

U.S. PATENT DOCUMENTS

| | | | |
|---|---|---|---|
| 2,203,767 | 6/1940 | Baldsiefen | 430/514 |
| 3,253,918 | 5/1966 | Condax | 430/512 |
| 3,459,128 | 8/1969 | Erdmann et al. | |
| 3,498,791 | 3/1970 | Rauhut | |
| 4,033,919 | 7/1977 | Lawson | |
| 4,328,304 | 5/1982 | Tachikawa | 430/331 |

FOREIGN PATENT DOCUMENTS

| | | |
|---|---|---|
| 24872 | 3/1981 | European Pat. Off. |
| 2659754 | 7/1978 | Fed. Rep. of Germany |
| WO79/00593 | 1/1979 | PCT Int'l Appl. |
| 1053276 | 12/1966 | United Kingdom |
| 1151368 | 5/1969 | United Kingdom |
| 1250541 | 10/1971 | United Kingdom |

OTHER PUBLICATIONS

Ullmanns Encyklopadie der Technischen Chemie—Dr. Foerst (translation appended).
Encyclopedia of Polymer Science and Technology—vol. 14, pp. 129 & 139.

Primary Examiner—Charles L. Bowers, Jr.
Attorney, Agent, or Firm—Schwartz, Jeffery, Schwaab, Mack, Blumenthal & Evans

[57] ABSTRACT

The invention relates to a solution and a process for desensitizing lithographic printing forms based on light-hardened diazo compounds and which are ready for printing. The desensitizing solution of the invention is composed of a water-soluble, film-forming, high molecular weight organic compound, a compound which has a high light-absorption in the spectral region in which the photolysis of light-sensitive aromatic diazo compounds is initiated, and water as the solvent.

The desensitizing solution protects the image stencil against the action of light and prevents any deterioration of the oleophilic character of the image stencil during storage.

3 Claims, No Drawings

PROCESS FOR DESENSITIZING DIAZO LITHOGRAPHIC PRINTING FORMS USING DESENSITIZING SOLUTION WITH LIGHT ABSORBING COMPOUND

This application is a division of application Ser. No. 397,092, filed 7/12/82, abandoned.

The present invention relates to a solution and a process for desensitizing (preserving) lithographic printing forms which have been developed and are ready for printing, in order to protect these plates against any access of air and soiling, while they are stored prior to being used for printing, and to simultaneously render their non-printing surface areas permanently hydrophilic.

It is known in the art that lithographic printing plates which are ready for printing must be subjected to such a protective treatment, before they are stored for a prolonged period of time. As the treating solution, an aqueous arabic solution is very widely used and it is also known to use dextrin solutions.

German Offenlegungsschrift No. 2,659,754 describes the use of aqueous polyvinyl alcohol solutions for the purpose of protecting lithographic printing forms.

U.S. Pat. No. 4,033,919 discloses combinations of polymers of acrylamide containing carboxyl groups with acids, particularly phosphoric acid, which are used as hydrophilizing and desensitizing agents for printing forms.

After treatment with a desensitizing solution, printing plates are usually stored for some time, frequently unprotected against light. In the case of negative-working printing plates, especially those containing diazonium salt condensation products as the light-sensitive compounds, it has been found that the oleophilic character, i.e., the ink receptivity of the image areas of the plates, is often considerably reduced upon storage, so that a very great number of useless printed sheets are obtained in the beginning of a printing run. This phenomenon is, above all, observed in printing plates in which the light-sensitive layers are predominantly or completely composed of diazonium compounds.

This problem is described in published European Patent Application No. 0,024,872. To overcome the problem it is proposed to add reactive substances, for example, azo couplers in acid or alkaline solution or reducing agents to the desensitizing solution. These substances react with the still present undestroyed diazonium compound and prevent a loss of ink receptivity. It is, however, a disadvantage of this process that the stability of the desensitizing solutions is reduced by the highly reactive substances contained therein. In the course of a prolonged storage of the desensitized plates, undesired reactions also may occur between the reactive constituents of the desensitizing material and the surface of the support and, as a result, the hydrophilic properties of the support are impaired. In addition, the possibility of adding acid hydrophilizing agents to the desensitizing material is limited to a great extent, due to the fact that the reactive substances are generally used in alkaline solution.

It is therefore an object of the present invention to provide a desensitizing solution which prevents a decrease in the ink receptivity of the desensitized printing plates and which does not contain any highly reactive constituents.

The present invention provides a solution for desensitizing lithographic printing plates based on light-hardened diazo compounds, which are ready for printing, the solution comprising a water-soluble, film-forming, high molecular weight organic compound and water as the solvent. The solution of the invention additionally contains a compound which has a high absorption of light in the spectral region in which the photolysis of light-sensitive aromatic diazo compounds is initiated.

According to the invention, a process for desensitizing lithographic printing plates based on light-hardened diazo compounds, which are ready for printing is also provided, in which a lithographic printing form is treated with an aqueous solution of a water-soluble, film-forming, high molecular weight organic compound and is then dried. In the process, a solution is used, which additionally contains a compound having a high absorption of light in the spectral region in which the photolysis of light-sensitive aromatic diazo compounds is initiated.

In the printing forms treated with the solution of the invention, the oleophilic character of the image areas and the hydrophilic character of the background areas are substantially maintained even upon storage and the desensitizing solutions of the invention retain their effectiveness even after they have been stored for a prolonged period of time.

The light-absorbing compounds should have a high absorption in the spectral region in which the diazo compounds contained in the light-sensitive layer are activated. Preferably, this absorption ranges from about 300 to 450 nm, particularly from 330 to 420 nm.

Suitable types of compounds include, for example, pyrazoline derivatives, 6-phenyl-α-pyrones, quinoline derivatives and other substituted heterocyclic compounds, as described, for example, in British Pat. Nos. 1,053,276; 1,151,368; and 1,250,541. Preferably, the compounds should be adequately soluble in water. Compounds which are capable of being dissolved when small amounts of organic solvents are added or which can be kept in a stable dispersion, if necessary by the addition of dispersing agents, are, however, also sufficient.

The concentrations of the light-absorbing compounds in the desensitizing solutions may vary within wide limits. Generally, the concentrations range between 0.1 and 10 percent by weight, preferably between 0.3 and 3 percent by weight.

As is generally known, the solutions contain water-soluble, film-forming organic polymers, in addition to the light-absorbing compounds. Basically, any substances which are conventionally used as constituents of desensitizing solutions for lithographic printing plates are suitable for this purpose, for example, gum arabic, dextrins, polyvinyl alcohol and the aforementioned acrylamide polymers. The high molecular weight compounds are usually present in a concentration ranging between 4 and 40 percent by weight, preferably between 5 and 35 percent by weight.

The desensitizing solutions may further contain hydrophilizing acids, for example, phosphoric acid or organic phosphonic acids.

In special cases, it may also be appropriate to add biocides, wetting agents or defoamers or small quantities, i.e., a few percent, of readily volatile organic solvents which are miscible with water.

The desensitizing solution may be applied to the surface by rubbing or dabbing on by hand, by immersion into a bath or by means of rollers, spray devices or the like, in a processing machine. After application, the solution is dried.

The support materials used for the printing forms to be treated are generally made of aluminum. In the first place, these include the known and preferably used support materials with improved surfaces, for example, mechanically, chemically or electrochemically roughened aluminum which optionally has been treated with alkali silicates, polymeric acids or other known agents. The solution of the present invention is particularly suitable for treating printing plates with supports of anodically oxidized aluminum, in which also the oxide layer may have been pretreated with the above-mentioned agents, for example, silicates or polyvinyl phosphonic acid.

The light-sensitive layers used are those based on diazonium salt condensation products or p-quinone diazides. Suitable materials of this kind are described in the following publications: German Pat. Nos. 1,104,824; 1,134,093; and 1,214,086 and German Offenlegungsschriften Nos. 2,024,244; 2,034,655; and 2,739,774.

In the examples which follow, preferred embodiments of the invention are explained. Parts by weight (p.b.w.) are related to parts by volume (p.b.v.) as the g to the ml. Percentages and quantitative ratios are based upon weight units, unless otherwise specified.

EXAMPLE 1

An aluminum foil which had been mechanically roughened by brushing was pretreated with a 0.1 percent concentration aqueous solution of polyvinyl phosphonic acid and then coated with a solution of
- 0.125 p.b.w. of the crude condensate of paraformaldehyde and diphenylamine-4-diazonium chloride, prepared in an 85 percent concentration phosphonic acid (cf. Example 1 of German Pat. No. 1,214,086),
- 8 p.b.w. of water, and
- 40 p.b.w. of dimethyl formamide, and was dried. The light-sensitive printing plate obtained was exposed under a 21-step continuous-tone step wedge with density increments of 0.15, in such a manner that a solid step 5 was obtained. The unexposed layer areas were washed away with water and the plate was fixed using a 1 percent concentration phosphoric acid. The plate was rubbed dry and then coated with the following desensitizing solution and dried:
- 10 p.b.w. of tapioca dextrin,
- 1 p.b.w. of glycerol,
- 0.3 p.b.w. of sodium-2,4-dinitro-diphenylamine-2'-carboxylate, and
- 88 p.b.w. of water.

After this treatment, one half of the plate was post-exposed without an original, for 5 minutes under a 5 kW xenon lamp. The plate was then clamped into a small offset press and used for proof printing. Already after the production of 15 copies, it was no longer possible to see any difference between the post-exposed portion and the remainder of the plate.

When this example was repeated with the same desensitizing solution to which a UV absorbing compound had, however, not been added, the post-exposed areas of the plate showed a reduced ink-receptivity up to 50 printed copies.

EXAMPLE 2

An electrolytically roughened and anodically oxidized aluminum sheet carrying an oxide layer of 3 g/m$^2$, which had been post-treated with a 0.1 percent concentration aqueous solution of polyvinyl phosphonic acid was coated with a solution of
- 1 p.b.w. of a diazonium salt polycondensation product, prepared by condensing 1 mole of 3-methoxy-diphenylamine-4-diazonium sulfate with 1 mole of 4,4'-bis-methoxymethyl-diphenyl ether in an 85 percent concentration phosphoric acid at 40° C. and isolated as the mesitylene sulfonate,
- 1.8 p.b.w. of a non-plasticized urea resin having an acid number below 3 and a dynamic viscosity of 6,000 mPa.s, measured in a 65 percent concentration solution in butanol/xylene (1:1) at 20° C., and
- 0.4 p.b.w. of crystal violet in
- 96.8 p.b.w. of ethylene glycol monomethyl ether and was dried.

The plate was exposed for 5 seconds using a 5 kW metal halide mercury vapor lamp and was then developed with a solution of
- 6 p.b.w. of MgSO$_4$×7H$_2$O,
- 20 p.b.w. of n-propanol and
- 0.7 p.b.w. of an alkyl phenol-polyglycol ether (about 8 to 10 glycol units) in
- 73.3 p.b.w. of water.

After developing, the plate was desensitized with the following solution:
- 30 p.b.w. of dextrin,
- 3 p.b.w. of glycerol,
- 0.1 p.b.w. of phosphonic acid (85% concentration) and
- 3 p.b.w. of the triethanol ammonium salt of 2-chloro-3-methyl-2-pyrone-6-(phenyl-4-sulfonic acid) in
- 63.9 p.b.w. of water.

As described in Example 1, one half of the printing plate was post-exposed and then proof printed. Only a slight difference in ink-receptivity was observed between post-exposed and the non-post-exposed layer areas.

EXAMPLE 3

The following solution was applied to an aluminum sheet which had been electrolytically roughened, anodically oxidized and post-treated with an aqueous solution of polyvinyl phosphonic acid:
- 1 p.b.w. of the diazonium salt polycondensation product specified in Example 2,
- 0.05 p.b.w. of crystal violet and
- 100 p.b.v. of ethyene glycol monomethyl ether.

The plate was exposed under an original and was then developed with a 5 percent concentration aqueous solution of sodium lauryl sulfate. For desensitizing the plate, the following solution was applied:
- 10 p.b.w. of tapioca dextrin,
- 1 p.b.w. of glycerol,
- 0.4 p.b.w. of phosphoric acid (85% concentration) and
- 1 p.b.w. of 1-(4-(dimethylaminoethoxy-ethylsulfonyl)-phenyl)-3-(4-chlorophenyl)-Δ$_2$-pyrazoline in
- 87.6 p.b.w. of water.

The plate was post-exposed and used for proof printing as indicated in Example 1. After printing 6 copies, the ink-receptivity of the post-exposed and the non-post-exposed layer areas was equally good. Similar results were obtained when the above-specified pyrazoline was replaced by the same quantity of 1-(4-(methylaminoethyl-sulfonyl)-phenyl)-3-(4-chlorophenyl)-$\Delta_2$-pyrazoline.

EXAMPLE 4

An electrolytically roughened and anodically oxidized aluminum sheet which had been post-treated with an aqueous solution of polyvinyl phosphonic acid was coated with a solution of 1 p.b.w. of the diazonium salt polycondensation product specified in Example 2,
3 p.b.w. of polyvinyl butyral (69–71% of vinyl butyral units, 1% of vinyl acetate units and 24–27% of vinyl alcohol units),
0.3 p.b.w. of phosphoric acid (85% concentration) in
75.7 p.b.w. of ethylene glycol monomethyl ether and
20.0 p.b.w. of butyl acetate and was dried. The plate was exposed imagewise and was developed with a solution of 1.5 p.b.w. of polyacrylic acid,
1.5 p.b.w. of acetic acid,
15 p.b.w. of isopropanol,
20 p.b.w. of n-propanol, and
50 p.b.w. of water.

For desensitizing the plate, the following solution was applied:

15 p.b.w. of gum arabic and
0.5 p.b.w. of 5-hydroxy-1-(4-sulfophenyl)-4-(4-sulfophenylazo)-pyrazole-3-carboxylic acid-trisodium salt in
84.5 p.b.w. of water.

The plate was post-exposed and used for proof printing as indicated in Example 1. After the production of a few prints, there was no longer any difference in the ink-receptivity of the post-exposed and the non-post-exposed layer areas of the printing stencil. When an identical plate was treated with a corresponding desensitizing solution which, however, did not contain the yellow dyestuff, more than 50 prints had to be made, before the post-exposed and the non-post-exposed layer areas had the same ink-receptivity.

EXAMPLE 5

A support made of mechanically roughened aluminum was coated with a solution of 1.5 p.b.w. of 1-(4-methylbenzenesulfonylimino)-2-(2,5-dimethyl-phenylaminosulfonyl)benzoquinone-(1,4)-diazide-(4), and
0.5 p.b.w. of a reaction product of a cresol formaldehyde novolak and chloroacetic acid in
100 p.b.v. of ethylene glycol monomethyl ether and was dried. The printing plate obtained was exposed under an original and developed with a solution of 10 p.b.w. of sodium metasilicate $\times 9H_2O$ and
0.3 p.b.w. of strontium hydroxide in
1000 p.b.v. of water.

The developed printing form was desensitized with the following solution:

17 p.b.w. of gum arabic and
2 p.b.w. of D,L-8-(4-amino-1-methyl-butylamino)-6-methoxy quinoline diphosphate in
81 p.b.w. of water.

The plate could be stored in light for a prolonged period without any deterioration in the ink-receptivity of the image stencil.

It will be obvious to those skilled in the art that many modifications may be made within the scope of the present invention without departing from the spirit thereof, and the invention includes all such modifications.

What is claimed is:

1. A process for desensitizing lithographic printing forms based on light-hardened diazo compounds selected from the group consisting of diazonium salt condensation product and p-quinone diazides and which forms are ready for printing, said process comprising treating a lithographic printing form with an aqueous desensitizing solution and then drying the printing form,
    said aqueous solution comprising an admixture of about 4 to 40 percent, relative to the weight of said solution, of a water-soluble, film-forming, high molecular weight organic compound selected from the group consisting of gum arabic, dextrin, polyvinyl alcohol and a water-soluble acrylamide polymer,
    and about 0.1 to 10 percent, relative to the weight of said solution, of a compound having a high absorption of light in the spectral region of 300 to 450 nm and being selected from the group consisting of pyrazoline derivatives, 2-chloro-3-methyl-2-pyrone-6-(phenyl-4-sulfonic acid) or a salt thereof, and quinoline derivatives.
2. A process according to claim 1 wherein the light-absorbing compound is water-soluble.
3. A process according to claim 1 in which the aqueous solution additionally comprises a hydrophilizing agent.

* * * * *